(12) United States Patent
Rossi et al.

(10) Patent No.: US 9,267,972 B2
(45) Date of Patent: Feb. 23, 2016

(54) INTEGRATED GALVANICALLY ISOLATED METER DEVICES AND METHODS FOR MAKING INTEGRATED GALVANICALLY ISOLATED METER DEVICES

(71) Applicant: Infineon Technologies Austria AG, Villach (AT)

(72) Inventors: Sergio Rossi, Genoa (IT); Renato Bessegato, Montebelluna (IT)

(73) Assignee: Infineon Technologies Austria AG, Villach (AT)

( * ) Notice: Subject to any disclaimer, the term of this patent is extended or adjusted under 35 U.S.C. 154(b) by 137 days.

(21) Appl. No.: 13/767,683

(22) Filed: Feb. 14, 2013

(65) Prior Publication Data

US 2014/0225594 A1   Aug. 14, 2014

(51) Int. Cl.
| | |
|---|---|
| G01R 21/08 | (2006.01) |
| G01R 3/00 | (2006.01) |
| G01R 21/06 | (2006.01) |
| G01R 22/10 | (2006.01) |
| G01R 22/06 | (2006.01) |

(52) U.S. Cl.
CPC ........... *G01R 21/08* (2013.01); *G01R 3/00* (2013.01); *G01R 21/06* (2013.01); *G01R 22/10* (2013.01); *G01R 22/063* (2013.01); *H01L 2224/48137* (2013.01); *H01L 2224/48465* (2013.01); *Y10T 29/49002* (2015.01)

(58) Field of Classification Search
CPC ........ G01R 21/08; G01R 3/00; G01R 15/185; G01R 15/20; G01R 15/202–15/207; G01R 21/06–21/09; G01R 22/10; Y10R 29/49002; H01L 2224/48137; H01L 2224/48465
USPC ........... 324/142, 117 R, 117 H, 76.11, 140 R, 324/141, 127, 522, 107
See application file for complete search history.

(56) References Cited

U.S. PATENT DOCUMENTS

| | | | | |
|---|---|---|---|---|
| 4,087,701 | A * | 5/1978 | Anderson | 307/149 |
| 4,427,900 | A * | 1/1984 | Aumont et al. | 307/149 |
| 4,700,188 | A * | 10/1987 | James | 340/870.03 |
| 6,107,674 | A * | 8/2000 | Zommer | 257/642 |
| 7,174,261 | B2 * | 2/2007 | Gunn et al. | 702/62 |
| 2010/0019391 | A1 * | 1/2010 | Strzalkowski | 257/777 |
| 2011/0184675 | A1 * | 7/2011 | White | G01R 15/146 702/61 |
| 2012/0159641 | A1 | 6/2012 | Rossi et al. | |

* cited by examiner

*Primary Examiner* — Arleen M Vazquez
*Assistant Examiner* — Lee Rodak
(74) *Attorney, Agent, or Firm* — Slater & Matsil, L.L.P.

(57) ABSTRACT

An integrated galvanically isolated meter devices and method for making integrated meter devices are disclosed. An embodiment of an integrated meter device includes a carrier, a control chip disposed on the carrier, a first measuring device chip disposed on the carrier, the first measuring device chip galvanically isolated from the control chip and configured to measure at least one first parameter of a first wire of a power line and a package encapsulating the control chip and the first measuring device chip.

15 Claims, 9 Drawing Sheets

INTEGRATED GALVANICALLY ISOLATED METER DEVICES AND METHODS FOR MAKING INTEGRATED GALVANICALLY ISOLATED METER DEVICES

TECHNICAL FIELD

Embodiments of the present invention relate to a meter arrangement and in particular embodiments to an integrated meter device.

BACKGROUND

Power line meter devices can be used to track one or more parameters on one or multiple phases of a power line or a power line. A meter device is usually an electronic device which is coupled to the power line and which is adapted to measure the voltage and current of the power line. Data representing the voltage and current of the power line can be processed and stored in order to determine power or energy consumption. The user and the utility provider are then able to access this data remotely or at the location at any time. Power line metering can help utility providers manage overall energy consumption patterns and cope with peak-demand challenges. Moreover, power line metering can provide better service to the utilizer. Power line metering can help customers to better manage their own usage, for example.

Several solutions for electric meters on single- or polyphase power lines or power lines already exist. In a typical poly-phase meter arrangement the power parameters of each phase can be measured using a current transformer and a voltage transformer. For single-phase meter arrangements, solutions are known which use resistors, shunts, voltage dividers and/or current transformers. The parameters such as the power parameters and the power quality parameters such as the power factor, the harmonic distortion, the dc offset, etc. can be calculated from the sampled data using a digital signal processor or a general purpose processor.

Electric meters typically comprise several discrete packaged devices. For example, an electric meter may comprise a discrete sensing device such as a sensor (e.g., hall sensor) or a transformer and a discrete galvanic insulator such as an opto-coupler.

Because cost, space and the number of chips are always crucial, there is a need for a meter arrangement which requires fewer and more cost efficient chips (e.g., shunts or voltage dividers) and therefore is more optimized in terms of cost and space as compared to current solutions.

SUMMARY OF THE INVENTION

In accordance with an embodiment of the present invention, an integrated meter device comprises a carrier, a control chip disposed on the carrier, a first measuring device chip disposed on the carrier, the first measuring device chip galvanically isolated from the control chip and configured to measure at least one first parameter of a first wire of a power line and an encapsulant encapsulating the control chip and the first measuring device chip.

In accordance with an embodiment of the present invention an integrated meter device comprises a low side unit, at least one intermediate unit and a first galvanic isolation, the first galvanic isolation isolating the at least one intermediate unit from the low side unit. The integrated meter device further comprises a high side unit and a second galvanic isolation, the second galvanic isolation isolating the at least one intermediate unit from the high side unit, wherein the high side unit is configured to measure at least one parameter of a power line.

In accordance with an embodiment of the present invention a method for manufacturing an integrated meter device comprises placing a first chip on a carrier, placing a second chip on the carrier, the second chip configured to measure at least one parameter of a first wire of a power line, electrically connecting the first chip and the second chip such that the first chip and the second chip are galvanically isolated and encapsulating the first chip and the second chip in a package.

In accordance with an embodiment of the invention a method for manufacturing an integrated meter device comprises placing a first chip on a carrier, placing a second chip on the carrier, the second chip configured to measure at least one parameter of a power line, placing a first intermediate chip on the carrier. The method further comprises electrically connecting the first chip to the second chip and galvanically isolating the first chip from the second chip via the first intermediate chip and encapsulating the first and second chips and the first intermediate chip in a package.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely integrated galvanically isolated meter devices. The invention may also be applied, however, to other integrated devices or other packaged meter devices.

Conventional power meters often comprise a meter device (comprising several chips or components) and discrete analog chips configured to sense current or voltage such as current transformers or voltage dividers, hall sensors, or shunt sensors. All these different chips or components need galvanic isolation (typically by implementing optocouplers) and individual power supplies. Therefore, these conventional power meters require many chips or components, need lots of space and have a high bill of material cost.

Figure 1A:
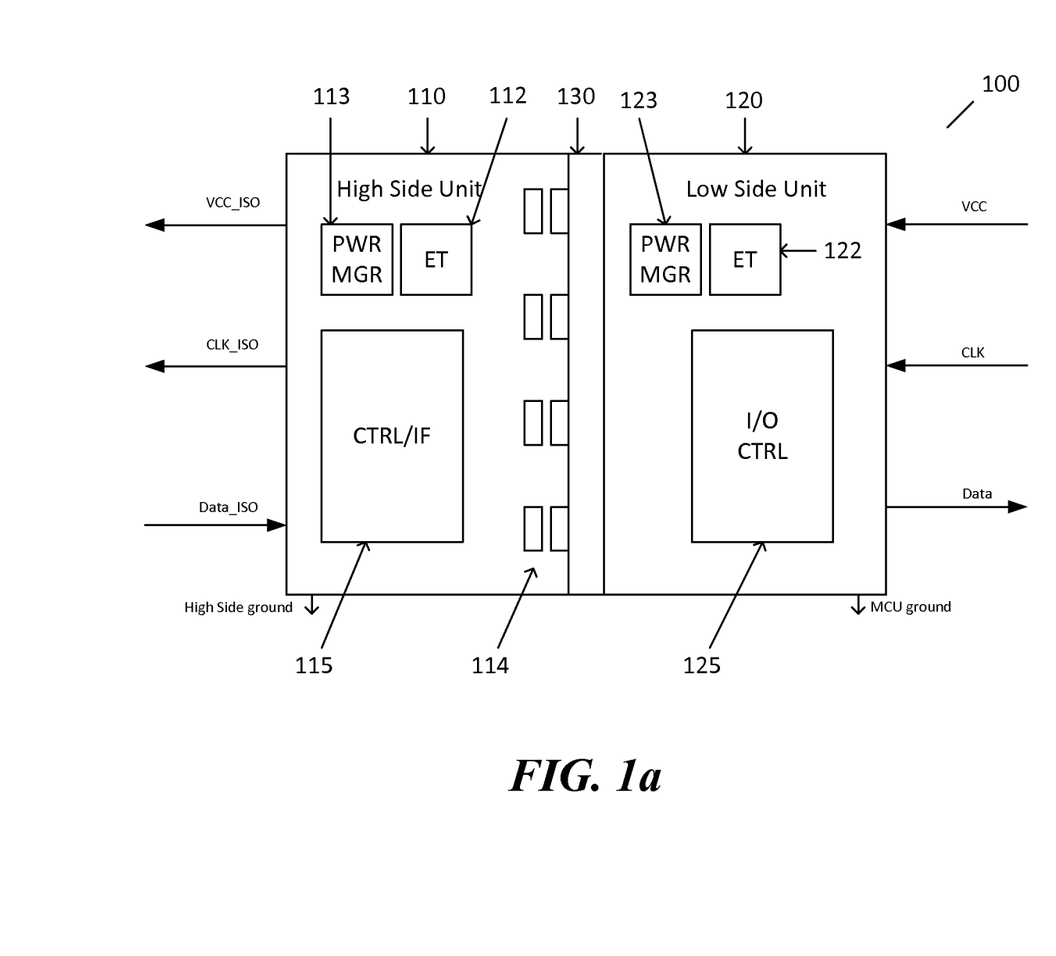
FIG. 1a shows an embodiment of an integrated meter device packaged into a single package.

FIG. 1a shows an embodiment of an integrated meter device 100 according to one embodiment of the present invention. The integrated meter device 100 comprises several components or chips integrated in a single package. For example, the integrated meter device 100 comprises a high side unit 110 as a chip and a low side unit 120 as a chip.

The high side unit 110 is configured to be coupled to voltage and/or current sensors which in turn are coupled a power line. The high side unit or measuring unit 110 is configured to receive (or measure) a sensed signal of at least one parameter of the power line such as voltage a current. The high side unit 110 is configured to operate with a first voltage. The low side unit or control unit 120 is configured to drive the high side unit 110. The low side unit 120 is further configured to calculate, process and/or transfer data. The low side unit 120 is configured to operate with a second voltage. The low side unit 120 is coupled to the high side unit via the galvanic interface 130.

The galvanic interface 130 may comprise a magnetic transfer unit. An advantage of a magnetic transfer unit over a conventional device is increased safety because of a reduced manipulation risk (e.g., tampering). In various embodiments, the magnetic transfer unit is a transformer or a coreless transformer with a primary winding connected to the high side unit 110 and a secondary winding connected to the low side unit 120. The transformer or coreless transformer may be integrated in the high side unit 110.

In various embodiments the magnetic transfer unit 130 is configured to transfer data and/or energy from the low side unit 120 to the high side unit 110. The galvanic interface 130 provides a data communication channel and a power channel between the low side unit 120 and the high side unit 110. Via a data communication channel data can be sent from the high side unit 110 to the low side unit 120 or from the low side unit 120 to the high side unit 110. For example, the high side unit 110 measures or receives sensed signals of a parameter of a power line and provides data representing the measured parameter to the low side unit 120. The low side unit 120 may process the data and determines the power consumption. If necessary, the control unit 120 sends data to the high side 110 via the data communication channel.

The power channel provides a path for energy transmission between the high side unit 110 and the low side unit 120. The power channel may provide to the high side unit 110 the energy necessary to operate. In various embodiments, no additional power supply is provided to the high side unit 110.

In conventional meter arrangements, the high side unit 110 and the control unit 120 each have a dedicated power supply. This increases not only the number of parts needed but also space and total cost. Here, (auxiliary) power supplies for individual units (e.g., chips) such as the high side unit 110 can be avoided.

In other embodiments the magnetic transfer unit 130 is configured to transfer data and/or energy from the low side unit 120 to the high side unit 110 keeping the circuits galvanically isolated from each other.

The high side unit 110 comprises an energy transfer unit 112 and a power management unit 113. The power transfer unit 112 is configured to receive energy via the transfer device 114 (e.g., galvanic interface, which may be integrated in the high side unit 110) and the power management unit 113 is configured to manage and control the power of the high side unit 110. In some embodiments the magnetic transfer device 114 may not be a constant power transmission but transmits an oscillating or pulsed signal. In such cases the energy transfer unit 112 is configured to generate a DC supply voltage from the oscillating or pulsed signal received from the low side unit via the power channel.

The high side unit 110 further comprises a control unit (CTRL/IF) 115. The control unit 115 comprises circuitry such as at least one analog to digital converter (ADC). In some embodiments there are two ADCs. In other embodiments there are four ADCs. The control unit is configured to sample the analog input signals coming from the analog sensors (e.g., voltage or current sensors). The circuitry is configured to mix the data output from ADCs and forward the mixed signal of the communication channel(s) of the galvanic interface 114.

The low side unit 120 comprises an energy transfer unit 122. The energy transfer unit 122 is configured to send energy via the galvanic interface 114 to the high side unit 110. The low side unit 120 further comprises a control unit 125 and a power management unit 123. The control unit 125 comprises circuitry to drive the high side unit 110 and digitally mix data coming from the outside of the low side unit 120.

Figure 1B:
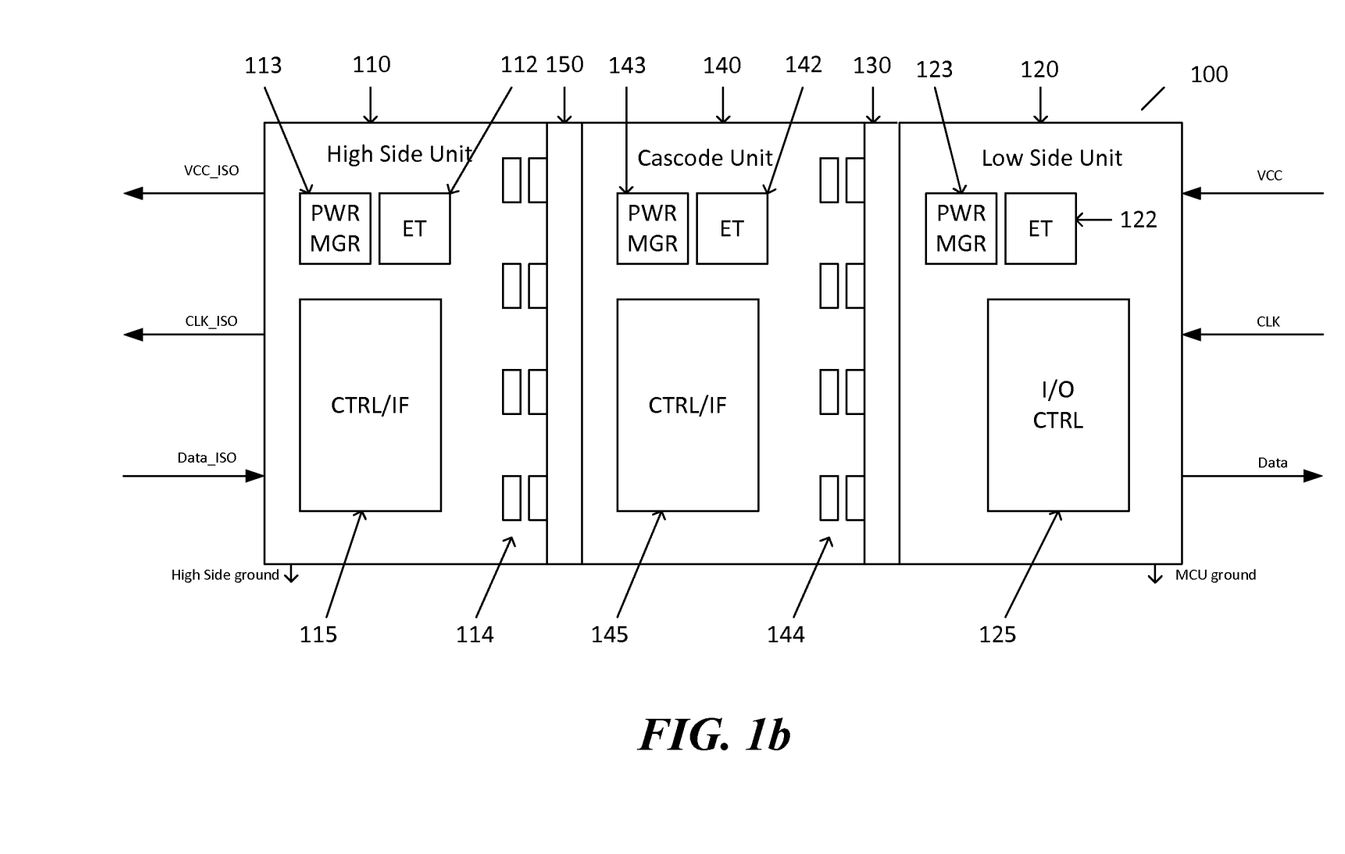
FIG. 1b shows another embodiment of an integrated meter device packaged into a single package.

FIG. 1b shows an embodiment of an integrate meter device 100. The integrated meter device 100 is integrated in a single package. In contrast to the embodiment of FIG. 1a, the integrated meter device 100 comprises an intermediate unit 140 (e.g., a cascode unit) between the high side unit 110 and the low side unit 120. The high side unit 110, the intermediate unit 140 and the low side unit 120 may be individual chips. The intermediate unit 140 is connected via a first galvanic interface 130 to the low side unit 110 and via a second galvanic interface 150 to the high side unit 110. The intermediate unit is configured to operate with a third voltage. The first to third voltages may be the same or may be different. Advantageously embodiments of the intermediate unit 140 save an additional power supply.

The first and second galvanic interfaces 130, 150 may comprise transfer units such as magnetic transfer units. In various embodiments the magnetic transfer unit is a transformer or a coreless transformer. For example, a primary winding of the first galvanic interface 130 is connected to the low side unit 120 and a secondary winding of the first galvanic interface 130 is connected to the intermediate unit 140. Moreover, a primary winding of the second galvanic interface 150 is connected to the high side unit 120 and a secondary winding of the second galvanic interface 150 is connected to the intermediate unit 140.

In various embodiments, the first transformer or coreless transformer 150 is integrated in the high side unit 110 and the second transformer or coreless transformer 130 is integrated in the intermediate unit 140. Alternatively, the first and second transformers or coreless transformers 130, 150 are integrated in the intermediate unit 140. In yet other embodiments the first transformer or coreless transformer 150 is integrated in the high side unit 110 and the second transformer or coreless transformer 130 is integrated in the low side unit 120. Other architectures are also possible.

In various embodiments, the transfer units 130, 150 are configured to transfer data and/or energy from the high side unit 110 to the intermediate unit 140 and from the intermediate unit 140 to the low side unit 120 keeping the circuits in the low side unit 120 and the high side unit galvanically isolated from each other. In other embodiments the magnetic transfer unit 130 is configured to transfer data and/or energy from the low side unit 120 to the intermediate unit 140 and from the intermediate unit 140 to the high side unit 110.

The galvanic interfaces 130, 150 provide a data communication channel and a power channel between the low side unit 120, intermediate unit 140 and the high side unit 110. Via the data communication channel data can be sent from the high side unit 110 via the intermediate unit 140 to the low side unit 120 or from the low side unit 120 via the intermediate unit 140 to the high side unit 110.

The power channels of the galvanic interfaces 130, 150 provide a path for energy transmission between the high side unit 110, intermediate unit 140 and the low side unit 120. The power channel may provide to the high side unit 110 and the intermediate unit 140 the energy necessary to operate. In various embodiments, no additional power is provided to the high side unit 110 and/or intermediate unit 140.

The intermediate unit 140 comprises an energy transfer unit 142 and a power management unit 143. The power transfer unit 142 is configured to receive energy via the power channel of the transfer device 144 (e.g., magnetic transfer unit) and configured to transmit energy via the transfer unit 114 (e.g., magnetic transfer unit) to the high side unit 110. Alternatively, the power transfer unit 142 is configured to receive energy via the power channel of the transfer device 114 and configured to transmit energy via the transfer unit 144 to the high side unit 110. The power management unit 143 is configured to manage and control the power of the intermediate unit 140. In embodiments the magnetic transfer devices 114, 144 may not provide a constant power transmission but transmits an oscillating or pulsed signal. In such cases the energy transfer unit 142 is configured to generate a DC supply voltage from the oscillating or pulsed signal received from the low side unit via the power channel.

The control unit 145 comprises circuitry to control the intermediate unit 140, drive the high side unit 110 and digitally mix data coming from the outside of the intermediate unit 140 to the data received from the high side unit 110 and/or low side unit 120.

Figure 1C:
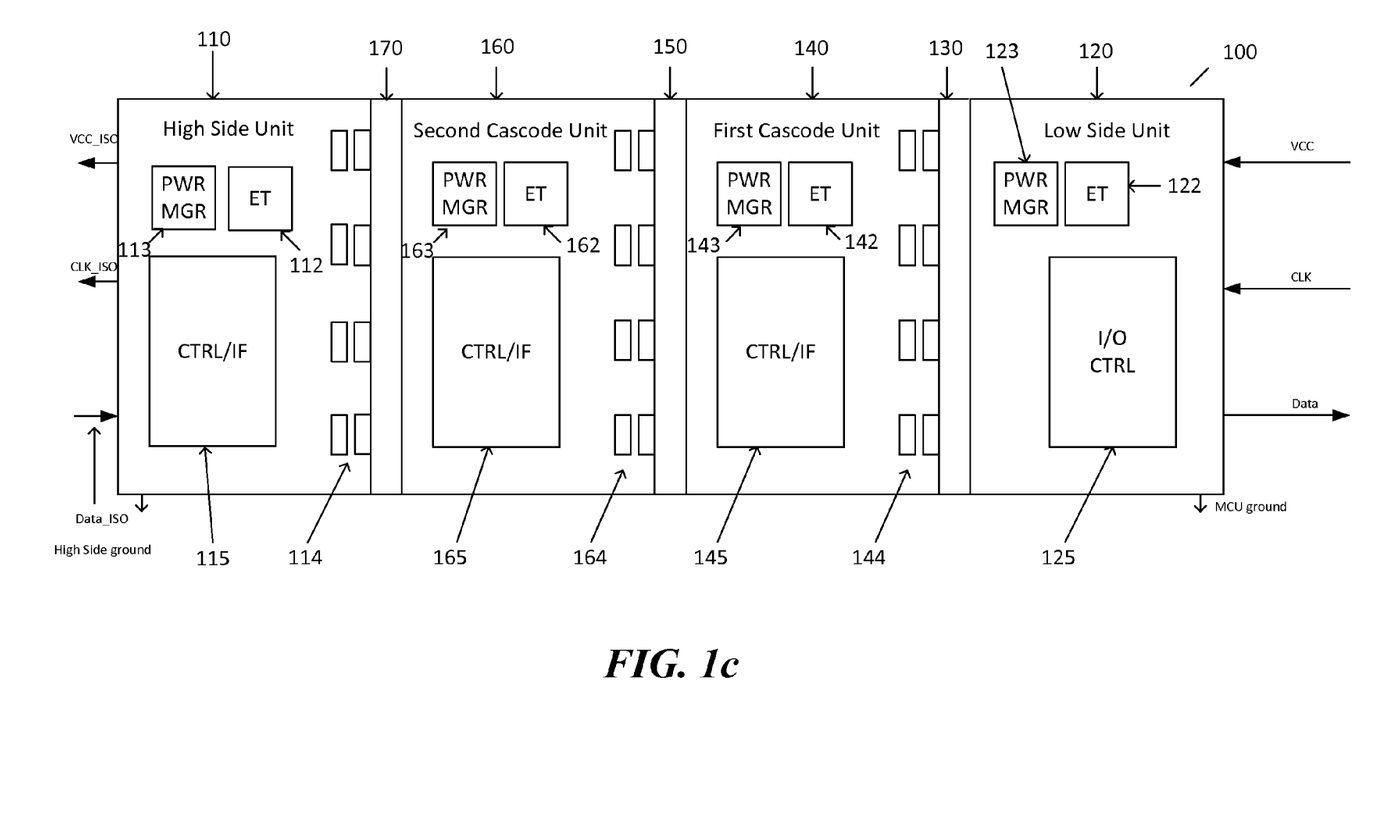
FIG. 1c shows yet another embodiment of an integrated meter device packaged into a single package.

FIG. 1c shows another embodiment of an integrate meter device 100. The integrated meter device 100 is integrated in a single package. The integrated meter device 100 comprises a plurality of intermediate units (e.g., cascode units) between the high side unit 110 and the low side unit 120. The plurality of intermediate units may be two or more intermediate units such as three or four intermediate units. Each intermediate unit may be on its own potential. The high side unit 110, the low side unit 120 and each of the intermediate units may be individual chips.

In various embodiments the integrated meter device 100 comprises a first intermediate unit 140 and a second intermediate unit 160. The first intermediate unit 140 is galvanically isolated from the low side unit 120 and the second intermediate unit 160 is galvanically isolated from the high side unit 110. The intermediate units 140, 160 are galvanically isolated from each other. The first to third galvanic interfaces 130, 150, 170 may comprise a magnetic transfer unit. In various embodiments the magnetic transfer unit is a transformer or a coreless transformer. For example, a primary winding of the first galvanic interface 130 is connected to the low side unit 120 and a secondary winding of the first galvanic interface 130 is connected to the first intermediate unit 140. Moreover, a primary winding of the second galvanic interface 150 is connected to the second intermediate unit 160 and a secondary winding of the second galvanic interface 150 is connected to the first intermediate unit 140. Finally, a primary winding of the third galvanic interface 170 is connected to the high side unit 110 and a secondary winding of the third galvanic interface 170 is connected to the second intermediate unit 160.

In various embodiments, the first galvanic interface 170 (e.g., transformer or coreless transformer) is integrated in the high side unit 110, the second galvanic interface 150 (e.g., transformer or coreless transformer) is integrated in the second intermediate unit 160 and the third galvanic interface 130 (e.g., transformer or coreless transformer) is integrated in the first intermediate unit 140. Alternatively, other configurations are possible. For example, one or more of the intermediate units 140, 160 may have two or none transformer or coreless transformer integrated. The high side unit 110 and the low side unit 120 may comprise configurations as described with respect to previous embodiments.

In various embodiments, the galvanic interfaces (e.g., magnetic transfer units) 130, 150, 170 are configured to transfer data and/or energy from the low side unit 120 to the first intermediate unit 140, from first intermediate unit 140 to the second intermediate unit 160 and then from the second intermediate unit 160 to the high side unit 110. The galvanic interfaces 130, 150, 170 provide a data communication channel and a power channel between the low side unit 120, first intermediate unit 140, second intermediate unit 160 and the high side unit 110. Via the data communication channel data can be sent from the high side unit 110 via the second intermediate unit 160 and the first intermediate unit 140 to the low side unit 120 or from the low side unit 120 via the first intermediate unit 140 and the second intermediate unit to the high side unit 110.

The power channel may provide to the high side unit 110, the first intermediate unit 140 and the second intermediate unit 160 the energy necessary to operate. In various embodiments, no additional power is provided to the high side unit 110 and/or the first and second intermediate units 140, 160.

Each of the intermediate units 140, 160 comprises an energy transfer unit 142, 162 and power management unit 143, 163. The energy transfer units 142, 162 are configured to receive and transmit energy via the power channels of the magnetic transfer devices 114, 144, 164. Each power management unit 143, 163 is configured to manage and control the power of the respective intermediate unit 140, 160. In embodiments the magnetic transfer devices 114, 144, 164 may not provide a constant power transmission but transmits an oscillating or pulsed signal. In such cases the energy transfer units 142, 162 are configured to generate a DC supply voltage from the oscillating or pulsed signal received through the power channel.

Each control unit 145, 165 comprises circuitry to control the respective intermediate unit 140, 160 and digitally mix data coming from the outside of the respective intermediate unit 140 to the data received from the high side unit 110 and/or low side unit 120 and/or other intermediate units.

Figure 2A:
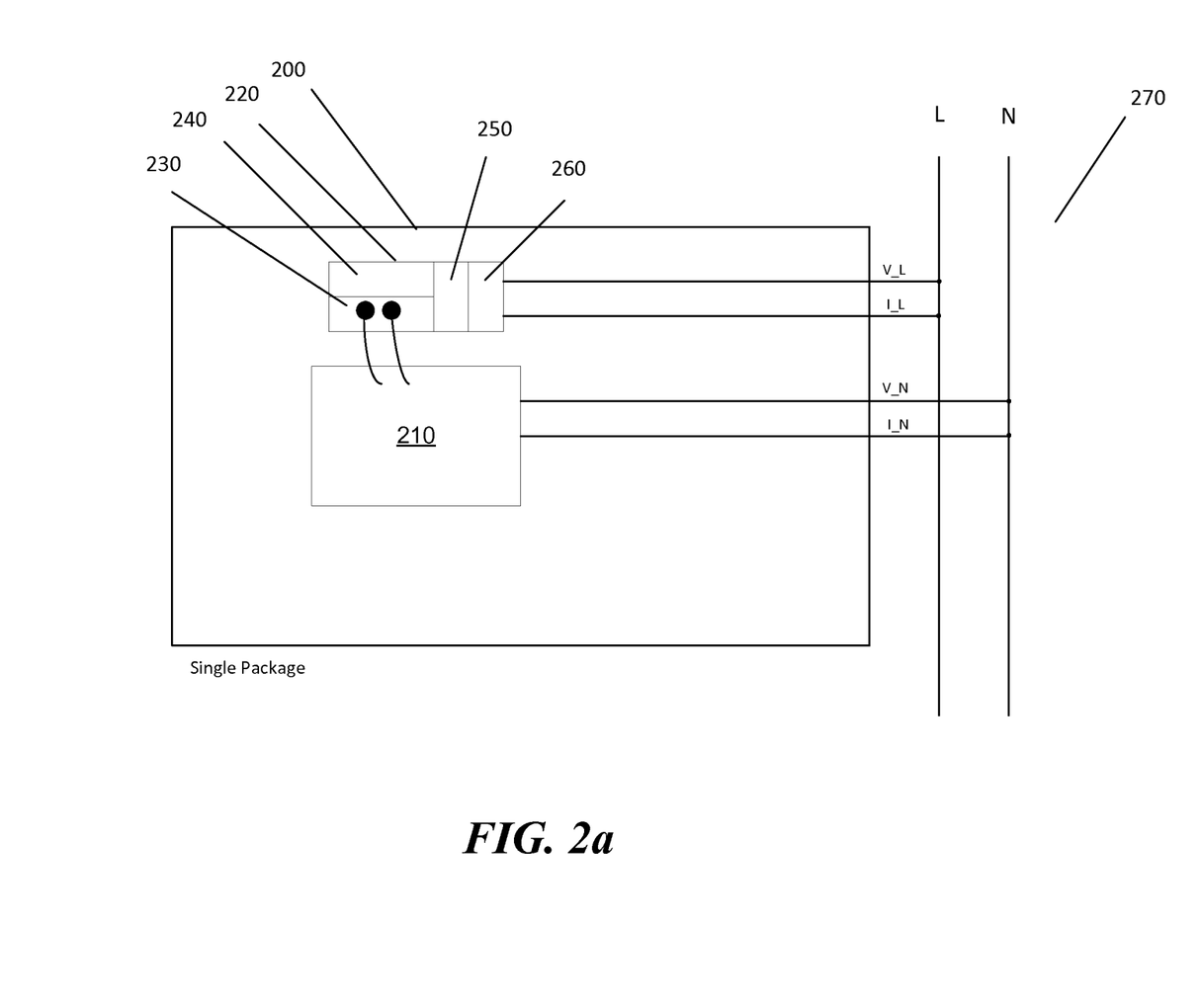
FIG. 2a shows an embodiment of an integrated meter device packaged into a single package.

FIG. 2a shows an integrated power meter 200 according to a single phase embodiment. The integrated power meter 200 is a single package. For example, the integrated power meter may comprise two chips or dies. The integrated power meter 200 is connected to the power line 270 (via sensors such as voltage or current sensors) and is configured to measure or configured to receive sensed signals of parameters of the power line 270.

The integrated power meter 200 includes a control chip 210 and a measurement device chip (also referred herein as galvanically isolated device chip or converting chip) 220. The control chip 210 and the measuring device chip 220 are disposed on a carrier such as a substrate or a board (e.g., a printed circuit board). The control chip 210 is galvanically isolated from the measuring device chip 220. The control chip 210 may be a single chip or a system on chip and the measuring device chip 220 may be a single chip or a system on chip. The measuring device chip 220 and the control chip 210 may all be encapsulated into a single package.

The measuring device chip 220 may be a galvanically isolated device chip configured to receive, convert and/or measure a voltage (or voltage signals) and/or a current (or current signals) of a power line. The galvanically isolated device chip 220 comprises a galvanic isolation unit 230, a power unit 240, analog digital converter unit 250 (comprising more than one (e.g., two) ADCs) and an analog front end unit 260. The galvanic isolation unit 230 is configured to galvanically isolate the control chip 210 from the measuring device chip 220. In one embodiment the galvanic isolation unit 230 comprises a magnetic transfer unit such as a transformer or a coreless transformer. Alternatively, the galvanic isolation unit 230 may comprise another device capable for galvanically isolating the control chip 210 from the galvanically isolated device chip 220 through another galvanically isolating interface such as an optical interface (e.g., infrared interface).

The analog front end unit 260 comprises circuitry to receive analog signals. For example, the analog front end unit 260 may receive voltage measuring signals or current measuring signals. The analog to digital converter unit (e.g., more than one ADCs) 250 comprise circuitry to convert analog signals to digital signals and/or circuitry to convert digital signals into analog signals. For example, the ADC unit 250 is configured to convert the analog voltage signals (sensed by a voltage sensor, not part of the package 200) or analog current measuring signals (sensed by a current sensor, not part of the package 200) into digital signals. The power unit 240 comprises circuitry to control and manage the power consumption and power requirements of the measuring device chip 220. For example, the power unit 240 is configured to transfer energy from the control chip 210. The galvanically isolated device chip 220 may not comprise an own power source or may not receive power from an external source other than through the galvanic interface unit 230.

The galvanic interface unit 230 may comprise a data communication channel and a power channel. The data communication channel provides a path for data transmission between the galvanically isolated device chip 220 and the control chip 210. Data can be sent from the galvanically isolated device chip 220 to the control chip 210 or from the control chip 210 to the galvanically isolated device chip 220. For example, data that is sent from the galvanically isolated device chip 220 to the control chip 210 is data representing the parameters measured or received by the galvanically isolated device chip 220. The power channel provides a path for energy transmission between the control chip 210 and the galvanically isolated device chip 220. The power channel provides energy to the galvanically isolated device chip 220 that is necessary to operate chip 220. In one embodiment no additional power supply is provided to the galvanically isolated device chip 220.

The control chip 210 comprises circuitry to measure, receive and/or convert analog signals to digital signals. For example, the control chip 210 comprises a measuring unit such as an analog front end unit and analog digital converter unit. The analog front end unit is configured to receive voltage measuring signals or current measuring signals. The received analog signals are converted by one or more ADCs. The control chip 210 is further configured to calculate, process and transfer data received through its own analog front end and received by the galvanically isolated device chip 220. The control chip 210 comprises circuitry to calculate, process and transfer data. The control chip 210 further comprises circuitry to interface and drive the galvanically isolated device chip 220.

In the arrangement of FIG. 2*a* the analog front end unit 260 of the galvanically isolated device chip 220 is coupled to the power line 270 and is configured to measure, receive and/or convert at least one parameter (or parameter signal) of the power line such as voltage and/or current. In various embodiments the galvanically isolated device chip 220 is configured to receive, measure and/or convert a parameter (or parameter signal) of a single phase of the power line 270 and is configured to provide the digital data to the control chip 210 via the data communication channel. For example, a voltage and a current are received, converted and forwarded to the control chip 210. The control chip 210 also receives and converts a voltage and a current of neutral of the power line 270. When data representing a voltage and a current are transmitted from the galvanically isolated device chip 220 to the control chip 210, the control chip can be configured to determine a power consumption of a load connected to the power line 270. Moreover, the control chip 210 can be configured to provide processed data, such as the power consumption or the digitized current and/or voltage, for example, to other components (not shown), which might further be coupled to the control unit chip 210 or to the integrated power meter 200.

According to one embodiment, the power channel is not only used to transfer energy, but may also be used to transfer a clock signal from the control chip 210 to the galvanically isolated device chip 220. In some cases it might be necessary to synchronize the clocks of the galvanically isolated device chip 220 and the control chip 210. Especially in digital circuits, a clock signal might be needed, to coordinate the actions of the circuits.

The control chip 210 may include a clock generator or clock recovery unit within its power supply unit in order to generate a clock signal. This clock signal can be transferred via the power channel or the communication channel of the galvanic interface to the galvanically isolated device chip 220. The galvanically isolated device chip 220 may also include a clock recovery unit within its power management unit 240. The clock recovery unit of the galvanically isolated device chip 220 is configured to receive clock signals from the clock generation unit of the control chip 210 and generate a clock signal CLK, which can be used to adapt the clock of the measuring device chip 220 to the clock of the control unit.

Figure 2B:
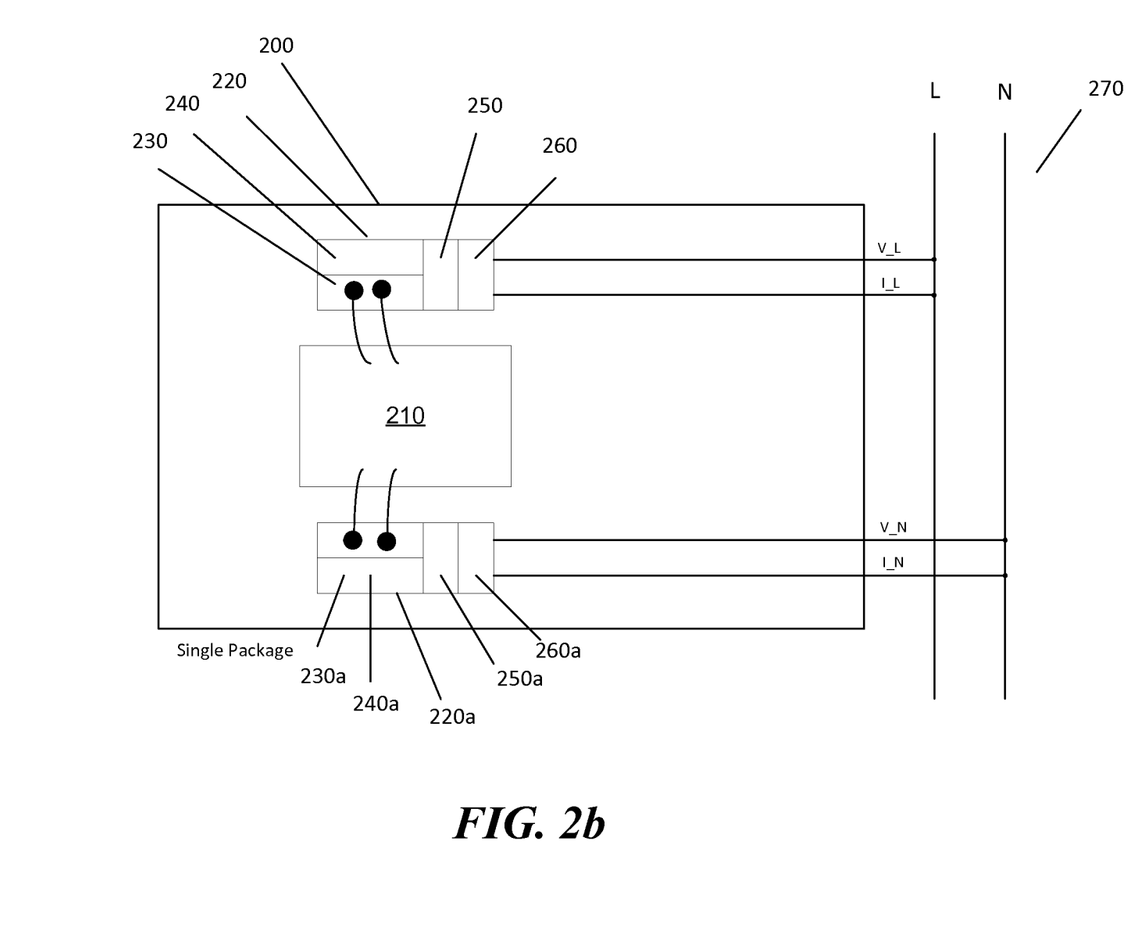
FIG. 2b shows another embodiment of an integrated meter device packaged into a single package.

FIG. 2*b* shows an integrated power meter 200 according to a double phase embodiment. The integrated power meter 200 is a single package. For example, the integrated power meter 200 may comprise three chips or dies. The integrated power meter 200 is connected to the power line 270 (via sensors such as voltage or current sensors) and is configured to measure parameters of the power line 270.

The integrated power meter 200 includes a control chip 210 and first and second measuring chips 220, 220*a* (or galvanically isolated device chips). The control chip 210 is disposed on a carrier such as a substrate or a board (e.g., a printed circuit board). The galvanically isolated device chips 220, 220*a* are also disposed on the carrier. The control chip 210 is galvanically isolated from the measuring device chip 220 and from the galvanically isolated device chip 220*a*. The control chip 210 may be a single chip or a system on chip and the galvanically isolated device chips 220, 220*a* may be a single chip or a system on chip. The galvanically isolated device chip 220, the galvanically isolated device chip 220*a* and the control chip 210 may all be encapsulated into a single package.

Each galvanically isolated device chip 220, 220*a* comprises a galvanic isolation unit 230, 230*a*, a power unit 240, 240*a*, an analog digital converter ADC unit 250, 250*a* (each ADC unit may comprise more than one analog-to-digital converter) and an analog front end unit 260, 260*a*. The galvanic isolation unit 230, 230*a* is configured to galvanically isolate the control chip 210 from the galvanically isolated device chip 220. In various embodiments the galvanic isolation unit 230 is the same as the galvanic isolation unit 230a. Alternatively, the galvanic isolation unit 230 is different than the galvanic isolation unit 230a. Similarly, the analog front end units 260, 260a, the ADCs 230, 230a, the power units 240, 240a are the same or are different.

In the arrangement of FIG. 2b the analog front end unit 260 of the galvanically isolated device chip 220 is coupled to a first phase L (e.g., a wire) of the power line 270 (via first sensor(s) such as a voltage and/or a current sensor) and is configured to measure, receive and/or convert at least one parameter (or parameter signal) of the first phase L of the power line 270, such as voltage and/or current. The galvanically isolated device chip 220 is configured to provide the measured data via the data communication channel to the control chip 210. Similarly, the analog front end unit 260a of the galvanically isolated device chip 220a is coupled to neutral N 270 (e.g., wire) (via second sensor(s) such as a voltage and/or a current sensor) and is configured to receive, convert and/or measure at least one parameter (or parameter signal) such as voltage or current of neutral N of the power line 270. The galvanically isolated device chip 220a is configured to provide the measured data via the data communication channel to the control chip 210. The control chip 210 receives this data from the galvanically isolated device chips 220, 220a and is configured to process this data. For example, the voltage and the current are measured for L and N, so that the control chip can calculate a power consumption of a load (not illustrated) connected to the power line 270.

The control chip 210 may be configured to provide processed data, such as the power consumption or the digitized current and/or voltage, for example, to other components (not shown), which may further be coupled to the control chip 210 or to the integrated power meter 200.

In various embodiments the galvanically isolated device chips 220, 220a receive the power from the control chip 210. For example, the galvanically isolated device chips 220, 220a receive the power exclusively through the power channel of the galvanic isolation unit 230, 230a.

Figure 2C:
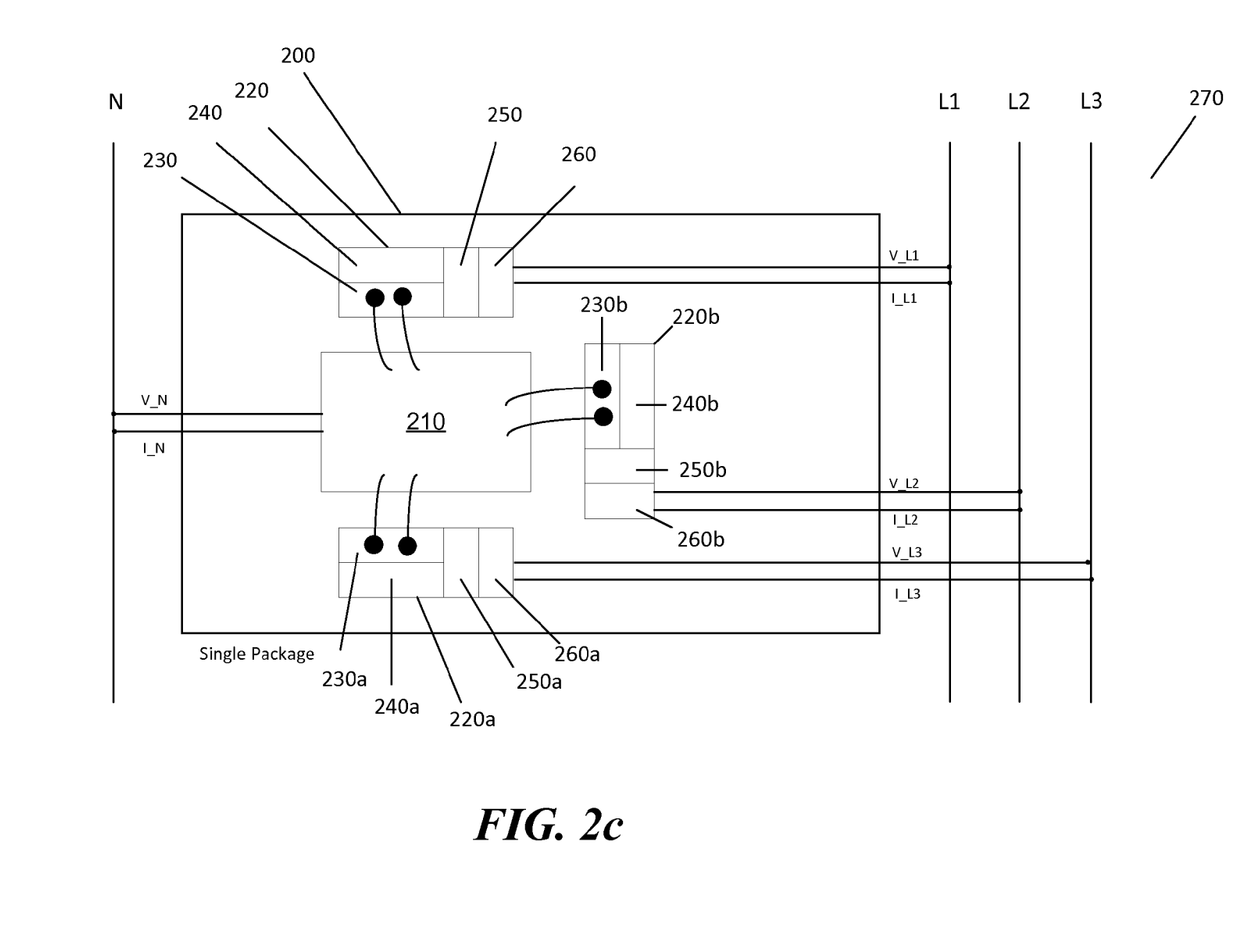
FIG. 2c shows yet another embodiment of an integrated meter device packaged into a single package.

FIG. 2c shows an integrated power meter 200 according to a multi-phase or poly-phase embodiment. The integrated power meter 200 is a single package. For example, the integrated power meter 200 may comprise four chips or dies. The integrated power meter 200 is connected to the power line 270 (via sensors such as voltage and/or current sensors) and is configured to measure parameters of the power line 270.

The power line often has more than one phase. For example, the integrated power meter 200 is configured to measure parameters of two or three phases. In various embodiments the power line 270 comprises three phases L1, L2 and L3 and neutral N. On each of the phases parameters such as voltage and current can be measured. Other parameters of the phase L1-L3 may be measured too.

FIG. 2c shows the integrated power meter 200 connected to each phase L1-L3 and the neutral N. The integrated power meter 200 includes a control chip 210 and first to third galvanically isolated device chips 220, 220a, 220b. The control chip 210 and the galvanically isolated device chips 220, 220a, 220b are disposed on a carrier (e.g., a printed circuit board). The control chip 210 is galvanically isolated from each of the galvanically isolated device chips 220, 220a, 220b. The control chip 210 may be a single chip or a system on chip and each galvanically isolated device chip 220, 220a, 220b may be a single chip or a system on chip. The galvanically isolated device chip 220, the galvanically isolated device chip 220a, the galvanically isolated device chip 220b and the control chip 210 are all encapsulated into a single package.

Each galvanically isolated device chip 220, 220a, 220b comprises a galvanic isolation unit 230, 230a, 230b, a power unit 240, 240a, 240b, an analog digital converter unit 250, 250a, 250b (comprising more than one ADC) and an analog front end unit 260, 260a, 260b. The galvanic isolation unit 230, 230a, 230b is configured to galvanically isolate the control chip 210 from the galvanically isolated device chips 220, 220a, 220b. In various embodiments the galvanic isolation unit 230 is the same as the other galvanic isolation units 230a, 230b. Alternatively, the galvanic isolation unit 230 is different than the galvanic isolation units 230a, 230b. Similarly, the analog front end units 260, 260a, 260b, the ADC units 250, 250a, 250b the power units 240, 240a, 240b are the same or are different.

The control chip 210 may comprise an analog front end and an analog to digital converter unit (the analog to digital converter unit may comprise one or more ADCs).

The first galvanically isolated device chip 220 is connected to phase L1 (e.g., a first wire) via a first voltage and/or a current sensor. The first galvanically isolated device chip 220 is configured to receive, convert and/or measure one or more first parameter(s) (or first parameter signals) of phase L1. The second galvanically isolated device chip 220a is connected to phase L2 (e.g., a second wire) via a second voltage and/or a current sensor. The second galvanically isolated device chip 220a is configured to receive, convert and/or measure one or more second parameter(s) (or second parameter signals) of phase L2. The third galvanically isolated device chip 220b is connected to phase L3 (e.g., a third wire) via a third voltage and/or a current sensor. The third galvanically isolated device chip 220b is configured to receive, convert and/or measure one or more third parameter(s) (or third parameter signals) of phase L3. The control chip 210 is connected to neutral (e.g., a fourth wire) via a fourth voltage and/or a current sensor. The control chip 210 is configured to receive, convert and/or measure one or more fourth parameter(s) (or first parameter signals) of neutral.

Because each phase and neutral N have different voltages, measuring device chips 220-220b is needed to measure current and voltage of each phase L1-L3. In various embodiments each of the measuring device chips 220-220b may be powered through the control chip 210 (and may not have an own power supply). In alternative embodiments each of the device chips 220-220b may be powered locally (not through the control chip 210). In yet alternative embodiments some of the device chips 220-220b may be powered locally and others centrally.

Figure 2D:
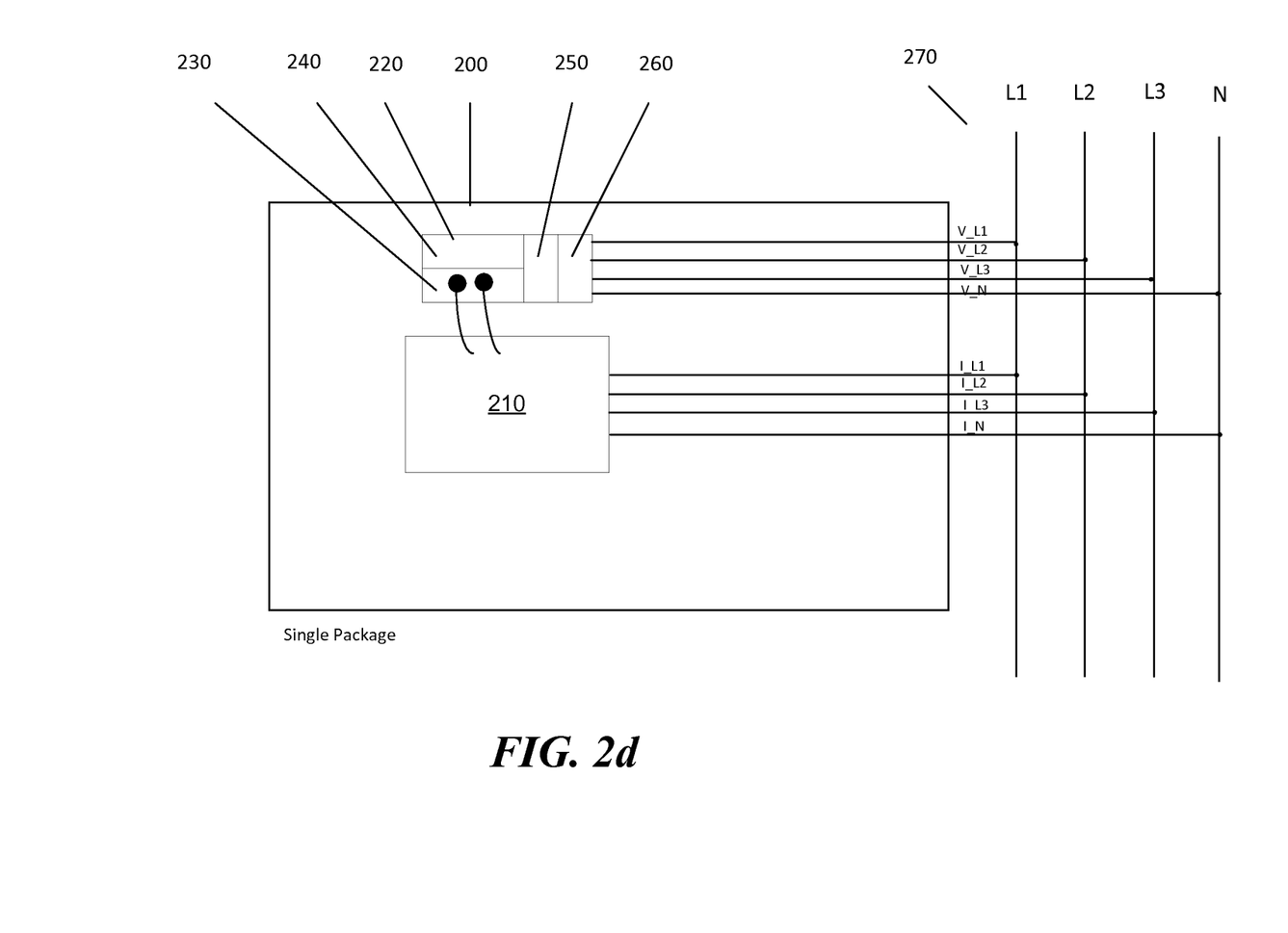
FIG. 2d shows another embodiment of an integrated meter device packaged into a single package.

FIG. 2d shows an integrated power meter 200 according to a multi-phase or poly-phase embodiment. The integrated power meter 200 is a single package. For example, the integrated power meter may comprise two chips or dies. The integrated power meter 200 is connected to the power line 270 (via sensors such as voltage and/or current sensors) and is configured to measure parameters of the power line 270.

The integrated power meter 200 includes a control chip 210 and a measuring device chip (also referred herein as galvanically isolated device chip) 220. The control chip 210 and the measuring device chip 220 are disposed on a carrier such a board (e.g., a printed circuit board). The control chip 210 is galvanically isolated from the measuring device chip 220. The control chip 210 may be a single chip or a system on chip and the measuring device chip 220 may be a single chip or a system on chip. The measuring device chip 220 and the control chip 210 may all be encapsulated into a single package.

The galvanically isolated device chip 220 comprises a galvanic isolation unit 230, a power unit 240, an analog digital converter unit 250 (the analog digital converter unit may comprise more than one ADC) and an analog front end unit 260 (all described supra). The control chip 210 may comprise an analog front end and an analog to digital converter unit (the analog to digital converter unit may comprise one or more ADCs).

The galvanically isolated device chip 220 is connected to phases L1-L3 and N (e.g., a first to fourth wires) via first voltage and/or current sensors. The galvanically isolated device chip 220 is configured to receive, convert and/or measure one or more first parameter(s) (or first parameter signals) of phases L1-L3 and N. For example, the galvanically isolated device chip 220 may receive sensed voltage signals of phases L1-L3 and N. Alternatively, the galvanically isolated device chip 220 may receive sensed current signals of phases L1-L3 and N. The control chip 210 is also connected to neutral (e.g., a first to fourth wires) via second voltage and/or current sensors. For example, the control chip 210 may receive sensed current signals of phases L1-L3 and N. Alternatively, the control chip 210 may receive sensed current signals of phases L1-L3 and N.

Because each phase and neutral N have different voltages and different currents, a measuring device chip 220 and a control chip 210 are needed to measure the current and the voltage of each phase L1-L3 and N. In various embodiments the measuring device chips 220 may be powered through the control chip 210 (and may not have an own power supply).

Figure 3:
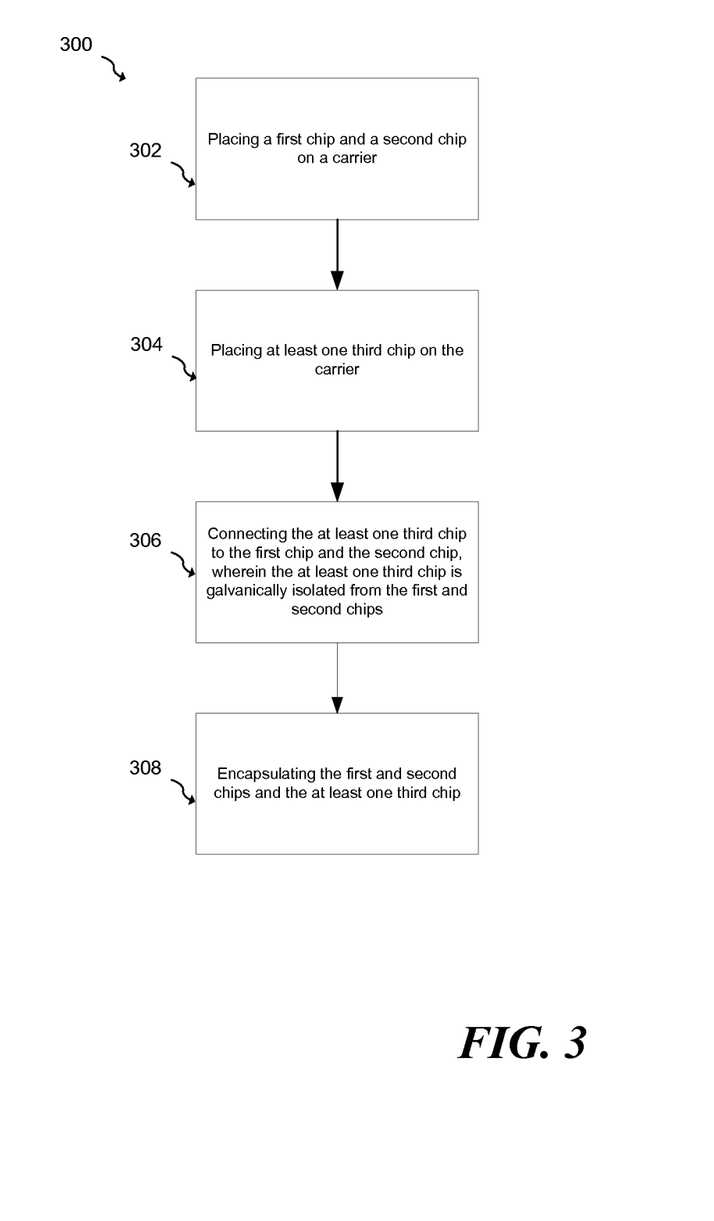
FIG. 3 shows an embodiment of a method to manufacture the integrated meter device.

FIG. 3 shows a flow chart 300 of a method for manufacturing an integrated meter device in accordance with an embodiment of the invention. In step 302 a first chip and a second chip are disposed on a carrier. The first chip and/or the second chip may be a semiconductor chip such as an integrated circuit chip. The first chip may comprise a measuring device or a high side unit and includes an analog front end and one or more analog-to-digital converters (ADCs). The first chip is configured to receive, convert and/or measure one or more parameters (or parameter signals) of a power line. The second chip may comprise a control driver and may be configured to drive and control the first chip (e.g., measuring device). Moreover, the second chip may be configured to measure one or more parameters of the power line. If second chip is configured to measure parameters of a power line, the second chip comprises an analog front end, analog-to-digital converters, etc.

The carrier may be a support substrate or a board such as a printed circuit board. Alternatively, the carrier is a leadframe.

The first and second chips may be attached to the carrier via a soft solder contact or a diffusion solder contact. Alternatively, the first and second chips may be attached to the carrier via a conductive adhesive or a conductive foil. Still alternatively, the first and second chips may be attached to the carrier via a (non-conductive) adhesive or adhesive foil.

In step 304 at least one third chip is placed on the carrier. The at least one third chip is an intermediate chip. The intermediate chip is configured to be electrically placed between the first chip and the second chip. The intermediate chip may be a semiconductor chip such as an integrated circuit (e.g., a cascode unit(s)).

The at least one third chip may be attached to the carrier via a soft solder contact or a diffusion solder contact. Alternatively, the at least one third chip may be attached to the carrier via a conductive adhesive or a conductive foil. Still alternatively, the at least one third chip may be attached to the carrier via a (non-conductive) adhesive or adhesive foil.

In step 306 the first and second chips are electrically connected to the at least one third chip (e.g., cascode unit). The first chip is electrically connect to the at least one third chip and the second chip is electrically connected to the at least one third chip. In various embodiments the first chip is not directly connected the second chip. The first chip is galvanically isolated from the at least one third chip and the second chip is galvanically isolated from the at least one third chip. In various embodiments if there are several third chips, these third chips are galvanically isolated from each other.

In various embodiments the first and second chips are electrically connected to the at least one third chip through wire or clip bonding. Alternatively, the first and second chips are electrically connected to the at least one third chip through electrical connections in the carrier. In some embodiments, the chips are connected through a combination of wire/clip bonding and electrical connections of the carrier.

In step 308 the chips are packaged or encapsulated with an encapsulant. Alternatively, the chips and the carrier are at least partially encapsulated with an encapsulant. The package comprises an encapsulation material comprising a molting compound, a ceramic, or laminate.

Figure 4:
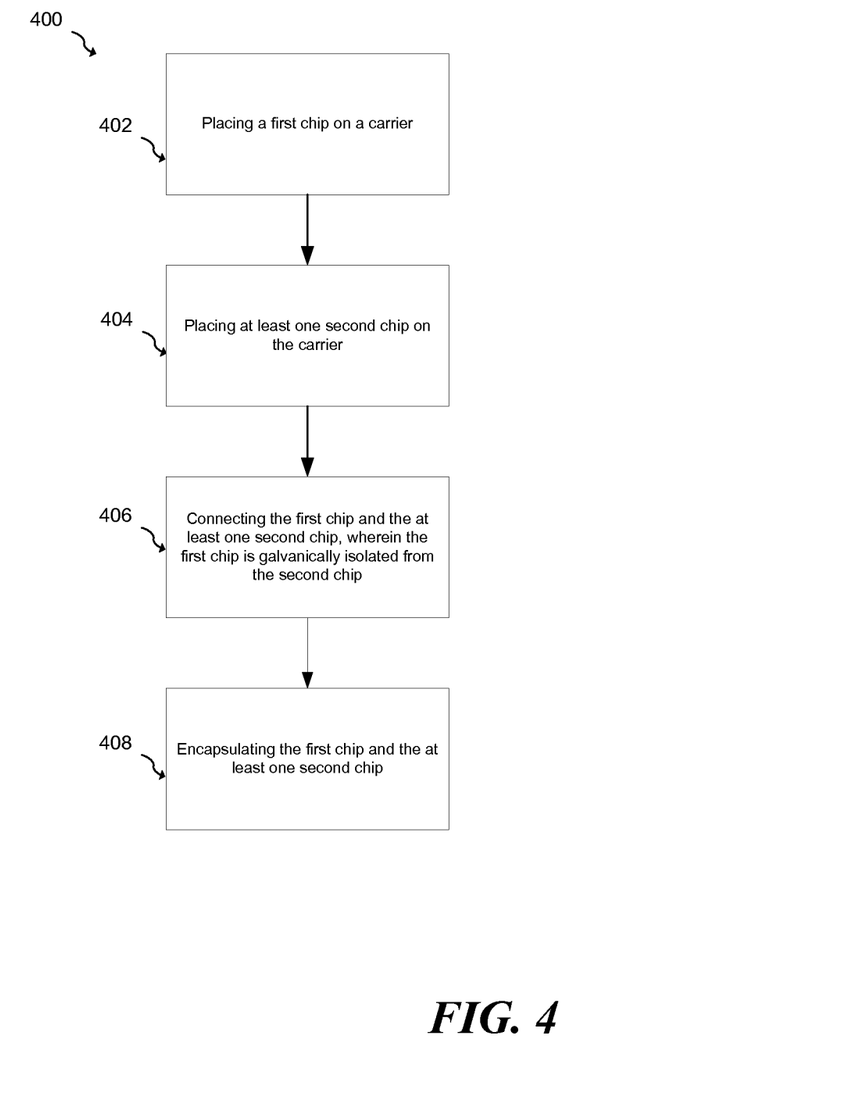
FIG. 4 shows an embodiment of a method to manufacture the device meter arrangement.

FIG. 4 shows a flow chart 400 of a method for manufacturing an integrated meter device in accordance with an embodiment of the invention. In step 402 a first chip is disposed on a carrier. The first chip may be a control device. The first chip is configured to drive and control the measuring chips or a plurality of measuring chips. In some embodiments the first chip is configured to receive, convert and/or measure at least one parameter (or parameter signals) of a power line. The first chip may be a semiconductor chip such as an integrated circuit chip.

The carrier may be a support substrate or a board such as a printed circuit board. Alternatively, the carrier is a leadframe.

The first chip may be attached to the chip carrier via a soft solder contact or a diffusion solder contact. Alternatively, the first chip may be attached to the chip carrier via a conductive adhesive or a conductive foil. Still alternatively, the first chip may be attached to the carrier via a (non-conductive) adhesive or adhesive foil.

In step 404 at least one second chip is placed on the carrier. The at least one second chip may be a measuring chip. The at least one second chip is configured to receive, convert and/or measure at least one parameter (or parameter signals) of a power line. The at least one second chip may be a semiconductor chip such as an integrated circuit chip. The at least one second chip may comprise an analog front end and one or more analog-to-digital converters (ADC). The at least one second chip may be further configured to comprise a galvanic isolation interface and a power control device (but in various embodiments has no power supply). In other embodiments the at least one second chip comprises embodiments described with respect to FIGS. 1a-1c. In some embodiments, the low side units for two or more second chips of the embodiments of FIGS. 1a-1c are removed from the element and integrated in a single chip (e.g., the first chip). In other embodiments, the low side units are controlled by an additional control device chip.

The at least one second chip may be attached to the carrier via a soft solder contact or a diffusion solder contact. Alternatively, the at least one second chip may be attached to the carrier via a conductive adhesive or a conductive foil. Still alternatively, the at least one second chip may be attached to the carrier via a (non-conductive) adhesive or adhesive foil.

In step 406 the first chip is electrically connected to the at least one second chip. The first chip is galvanically isolated from the at least one second chip. In various embodiments if there are several second chips, each of these second chips are galvanically isolated from the first chip. Some embodiments are described with respect to FIG. 2a-2d.

In various embodiments the first chip is electrically connected to the at least one second chip through wire or clip bonding. Alternatively, the first chip is electrically connected to the at least second chip through electrical connections in the carrier. In some embodiments, the chips are connected through a combination of wire/clip bonding and electrical connections of the carrier.

In step 408 the chips are encapsulated or packaged. Alternatively, the chips and the carrier are at least partially encapsulated. The package comprises an encapsulation material comprising a molting compound, a ceramic, or laminate.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, compositions of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods or steps.

What is claimed is:

1. An integrated meter device comprising:
a low side unit configured to operate with a first voltage;
an intermediate unit configured to operate with a second voltage;
a first magnetic transfer unit galvanically isolating the intermediate unit from the low side unit;
a high side unit configured to operate with a third voltage; and
a second magnetic transfer unit galvanically isolating the intermediate unit from the high side unit,
wherein the high side unit comprises an energy transfer unit, a power management unit and a control unit, wherein the energy transfer unit is configured to receive energy via the second magnetic transfer unit, wherein the power management unit is configured to control power of the high side unit, wherein the control unit is configured to control sensed data related to at least one parameter of a power line,
wherein the high side unit is configured to measure the at least one parameter of the power line,
wherein the first voltage, the second voltage and the third voltage are different,
wherein the high side unit and the second magnetic transfer unit are arranged in a first chip, wherein the intermediate unit and the first magnetic transfer unit are arranged in a second chip, wherein the low side unit is arranged in a third chip, and wherein all three chips are disposed on a carrier and encapsulated in a package.

2. The integrated meter device according to claim 1, wherein the first magnetic transfer unit is a first coreless transformer and the second magnetic transfer unit is a second coreless transformer.

3. The integrated meter device according to claim 1, wherein the low side unit is configured to provide power to the high side unit.

4. The integrated meter device according to claim 1, wherein the intermediate unit comprises a first intermediate unit and a second intermediate unit.

5. The integrated meter device according to claim 1, wherein the energy transfer unit is configured to generate a DC supply voltage from oscillated or pulsed signals.

6. An integrated meter device comprising:
a low side unit;
a first intermediate unit;
a first galvanic isolation, the first galvanic isolation isolating the first intermediate unit from the low side unit;
a second intermediate unit;
a second galvanic isolation, the second galvanic isolation isolating the second intermediate unit from the first intermediate unit;
a high side unit; and
a third galvanic isolation, the third galvanic isolation isolating the second intermediate unit from the high side unit,
wherein the high side unit comprises an energy transfer unit, a power management unit and a control unit, wherein the energy transfer unit is configured to receive energy via the third galvanic isolation, wherein the power management unit is configured to control power of the high side unit, wherein the control unit is configured to control sensed data related to at least one parameter of a power line,
wherein the high side unit is configured to measure the at least one parameter of the power line, wherein the high side unit and the third galvanic isolation are arranged in a first chip, wherein the second intermediate unit and the second galvanic isolation are arranged in a second chip, wherein the first intermediate unit and the first galvanic isolation are arranged in a third chip, wherein the low side unit is arranged in a fourth chip, and wherein all four chips are disposed on a carrier.

7. The integrated meter device according to claim 6, wherein the first galvanic isolation is a first coreless transformer, wherein the second galvanic isolation is a second coreless transformer, and wherein the third galvanic isolation is a third coreless transformer.

8. The integrated meter device according to claim 6, wherein the low side unit is configured to provide power to and receive data from the high side unit.

9. The integrated meter device according to claim 6, wherein the four chips disposed on the carrier are encapsulated in a package.

10. The integrated meter device according to claim 6, wherein the energy transfer unit is configured to generate a DC supply voltage from oscillated or pulsed signals.

11. An integrated meter device comprising:
a low side unit configured to operate with a first voltage;
an intermediate unit configured to operate with a second voltage;
a first galvanic isolation, the first galvanic isolation isolating the intermediate unit from the low side unit;
a high side unit configured to operate with a third voltage; and
a second galvanic isolation, the second galvanic isolation isolating the intermediate unit from the high side unit,
wherein the first voltage, the second voltage and the third voltage are different,
wherein the high side unit is configured to measure at least one parameter of a power line, wherein the high side unit comprises an energy transfer unit, a power management unit and a control unit, wherein the energy transfer unit is configured to receive energy via the second galvanic isolation, wherein the power management unit is configured to control power of the high side unit, wherein the control unit is configured to control data of the at least one parameter of the power line, wherein the high side unit communicates the measured parameter via the first galvanic isolation and the second galvanic isolation to the low side unit, wherein the high side unit and the second galvanic isolation are arranged in a first chip, wherein the intermediate unit and the first galvanic isolation are arranged in a second chip, wherein the low side unit is arranged in a third chip, and wherein all three chips are disposed on a carrier.

12. The integrated meter device according to claim 11, wherein the first galvanic isolation is a first coreless transformer and the second galvanic isolation is a second coreless transformer.

13. The integrated meter device according to claim 11, wherein the low side unit is configured to drive and power the high side unit.

14. The integrated meter device according to claim 11, wherein the three chips disposed on the carrier are encapsulated in a package.

15. The integrated meter device according to claim 11, wherein the energy transfer unit is configured to generate a DC supply voltage from oscillated or pulsed signals.

* * * * *